US008227874B2

(12) United States Patent
Adkisson et al.

(10) Patent No.: US 8,227,874 B2
(45) Date of Patent: Jul. 24, 2012

(54) SEMICONDUCTOR TRANSISTORS HAVING HIGH-K GATE DIELECTRIC LAYERS AND METAL GATE ELECTRODES

(75) Inventors: James William Adkisson, Jericho, VT (US); Michael Patrick Chudzik, Danbury, CT (US); Jeffrey Peter Gambino, Westford, VT (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 12/861,913

(22) Filed: Aug. 24, 2010

(65) Prior Publication Data
US 2010/0314697 A1 Dec. 16, 2010

Related U.S. Application Data

(62) Division of application No. 12/038,195, filed on Feb. 27, 2008, now Pat. No. 7,790,559.

(51) Int. Cl.
*H01L 29/78* (2006.01)
(52) U.S. Cl. . 257/411; 257/410; 257/412; 257/E29.263; 438/216; 438/287
(58) Field of Classification Search .......... 438/216, 438/261, 287, 591; 257/E29.263, 411, 410, 257/412, 408
See application file for complete search history.

(56) References Cited

U.S. PATENT DOCUMENTS

| 6,194,748 | B1 | 2/2001 | Yu |
| 6,444,512 | B1* | 9/2002 | Madhukar et al. ............ 438/203 |
| 6,515,338 | B1 | 2/2003 | Inumiya et al. |
| 6,664,592 | B2 | 12/2003 | Inumiya et al. |
| 7,138,323 | B2 | 11/2006 | Kavalieros et al. |
| 2001/0023120 | A1 | 9/2001 | Tsunashima et al. |
| 2004/0241937 | A1 | 12/2004 | Huang et al. |
| 2006/0011994 | A1 | 1/2006 | Lin et al. |
| 2006/0035425 | A1 | 2/2006 | Carter et al. |
| 2006/0211208 | A1 | 9/2006 | Parekh et al. |
| 2006/0292762 | A1 | 12/2006 | Borland et al. |
| 2007/0069300 | A1 | 3/2007 | Cheng et al. |

OTHER PUBLICATIONS

Notice of Allowance (Mail Date May 5, 2010) for U.S. Appl. No. 12/038,195, filed Feb. 27, 2008; Confirmation No. 5185.

* cited by examiner

*Primary Examiner* — Thinh T Nguyen
(74) *Attorney, Agent, or Firm* — Schmeiser, Olsen & Watts; David A. Cain

(57) ABSTRACT

A semiconductor structure. The semiconductor structure includes (i) a semiconductor substrate which includes a channel region, (ii) first and second source/drain regions on the semiconductor substrate, (iii) a final gate dielectric region, (iv) a final gate electrode region, and (v) a first gate dielectric corner region. The final gate dielectric region (i) includes a first dielectric material, and (ii) is disposed between and in direct physical contact with the channel region and the final gate electrode region. The first gate dielectric corner region (i) includes a second dielectric material that is different from the first dielectric material, (ii) is disposed between and in direct physical contact with the first source/drain region and the final gate dielectric region, (iii) is not in direct physical contact with the final gate electrode region, and (iv) overlaps the final gate electrode region in a reference direction.

18 Claims, 13 Drawing Sheets

US 8,227,874 B2

SEMICONDUCTOR TRANSISTORS HAVING HIGH-K GATE DIELECTRIC LAYERS AND METAL GATE ELECTRODES

This application is a divisional application claiming priority to Ser. No. 12/038,195, filed Feb. 27, 2008, now U.S. Pat. No. 7,790,559, issued Sep. 7, 2010.

FIELD OF THE INVENTION

The present invention relates generally to semiconductor transistors and more particularly to semiconductor transistors having high-K gate dielectric layers and metal gate electrodes.

BACKGROUND OF THE INVENTION

A typical semiconductor transistor having high-K gate dielectric layer and metal gate electrode usually has poor gate dielectric quality at bottom corners of the gate electrode. Therefore, there is a need for a structure (and a method for forming the same) in which the gate dielectric quality at bottom corners of the gate electrode has a higher quality than that of the prior art.

SUMMARY OF THE INVENTION

The present invention provides a semiconductor structure, comprising a semiconductor substrate which includes a channel region; a first source/drain region on the semiconductor substrate; a second source/drain region on the semiconductor substrate, wherein the channel region is disposed between the first and second source/drain regions; a final gate dielectric region, wherein the final gate dielectric region comprises a first dielectric material, wherein the final gate dielectric region is in direct physical contact with the channel region via an interfacing surface, and wherein the interfacing surface defines a reference direction perpendicular to the interfacing surface and pointing from the final gate dielectric region toward the channel region; a final gate electrode region, wherein the final gate dielectric region is disposed between and in direct physical contact with the channel region and the final gate electrode region, and wherein the final gate electrode region comprises an electrically conductive material; and a first gate dielectric corner region, wherein the first gate dielectric corner region comprises a second dielectric material that is different from the first dielectric material, wherein the first gate dielectric corner region is disposed between and in direct physical contact with the first source/drain region and the final gate dielectric region, wherein the first gate dielectric corner region is not in direct physical contact with the final gate electrode region, and wherein the first gate dielectric corner region overlaps the final gate electrode region in the reference direction.

The present invention provides a structure (and a method for forming the same) in which the gate dielectric quality at bottom corners of the gate electrode has a higher quality than that of the prior art.

DETAILED DESCRIPTION OF THE INVENTION

Figure 1A:
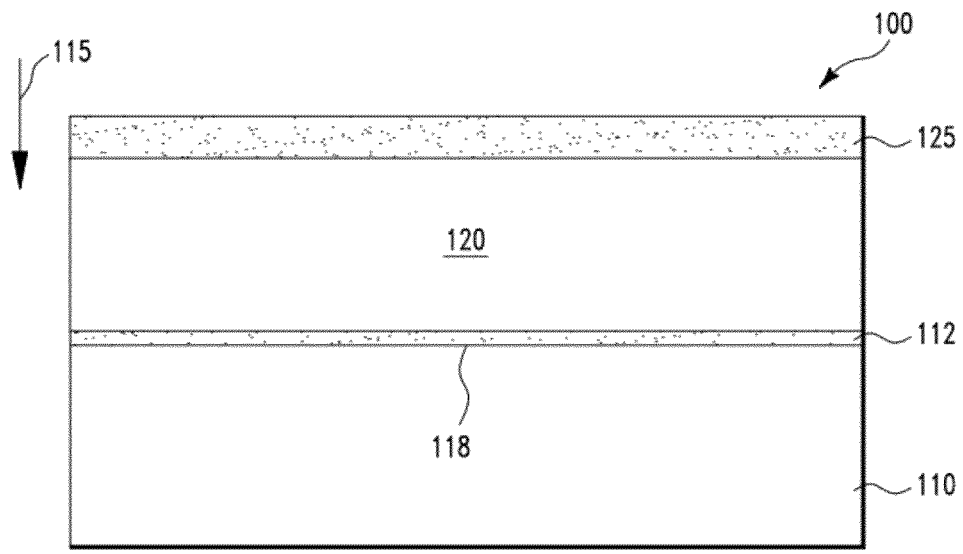
FIGS. 1A-1M show cross-section views used to illustrate a fabrication process of a semiconductor structure, in accordance with embodiments of the present invention.

FIGS. 1A-1M show cross-section views used to illustrate a fabrication process of a semiconductor structure 100, in accordance with embodiments of the present invention. More specifically, with reference to FIG. 1A, the fabrication process of the semiconductor structure 100 can start with a silicon substrate 110.

Next, in one embodiment, a temporary gate dielectric layer 112 is formed on top of the silicon substrate 110. The temporary gate dielectric layer 112 can comprise silicon dioxide. If silicon dioxide is used, the temporary gate dielectric layer 112 can be formed by thermally oxidizing the top surface 118 of the silicon substrate 110 resulting in the temporary gate dielectric layer 112.

Next, in one embodiment, a temporary gate electrode layer 120 is formed on top of the temporary gate dielectric layer 112. The temporary gate electrode layer 120 can comprise poly-silicon. The temporary gate electrode layer 120 can be formed by CVD (Chemical Vapor Deposition) of poly-silicon on top of the temporary gate dielectric layer 112 resulting in the temporary gate electrode layer 120.

Next, in one embodiment, a cap layer 125 is formed on top of the temporary gate electrode layer 120. The cap layer 125 can comprise silicon dioxide. The cap layer 125 can be formed by CVD of silicon dioxide on top of the temporary gate electrode layer 120 resulting in the cap layer 125.

Figure 1B:
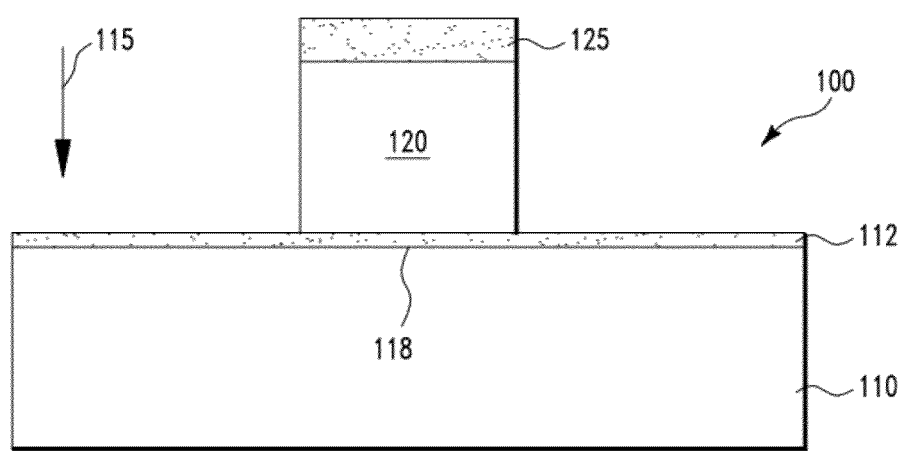

Next, in one embodiment, the cap layer 125 and the temporary gate electrode layer 120 are patterned resulting in the cap region 125 and the temporary gate electrode region 120 of FIG. 1B. More specifically, the cap layer 125 and the temporary gate electrode layer 120 can be patterned by anisotropically and selectively etching in a direction defined by an arrow 115 (hereafter can be referred to as the direction 115) resulting the cap region 125 and the temporary gate electrode region 120 of FIG. 1B. The direction 115 is perpendicular to the top surface 118 of the silicon substrate 110 and points from the temporary gate dielectric layer 112 toward the silicon substrate 110.

Figure 1C:
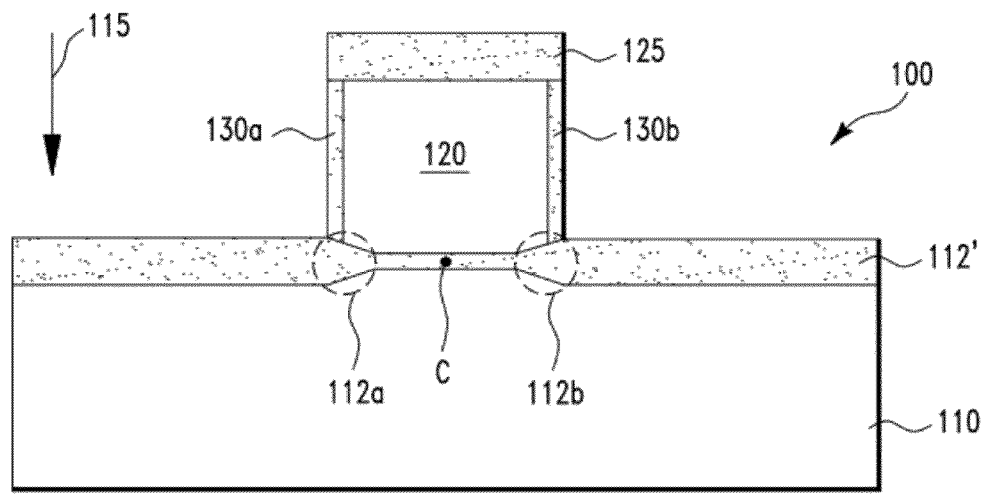

Next, with reference to FIG. 1B, in one embodiment, a thermal oxidization of the exposed surfaces of the structure 100 of FIG. 1B is performed resulting in dielectric regions 130a and 130b of FIG. 1C on side walls of the temporary gate electrode region 120. Also as a result of this thermal oxidization step, most of the portions of the temporary gate dielectric layer 112 of FIG. 1B increase in thickness in the direction 115 resulting in the temporary gate dielectric layer 112'. More specifically, the closer to the surrounding ambient a portion of the temporary gate dielectric layer 112 of FIG. 1B is, the thicker in the direction 115 this portion is. For instance, with reference to FIG. 1C, for the portions of the temporary gate dielectric layer 112' sandwiched between the temporary gate electrode region 120 and the silicon substrate 110, the closer to the center point C a portion is, the thinner in the direction 115 this portion is.

The temporary gate dielectric layer 112' comprises bird's beaks 112a and 112b at bottom corners of the temporary gate electrode region 120. The dielectric regions 130a and 130b and the temporary gate dielectric layer 112' can comprise silicon dioxide.

Figure 1D:
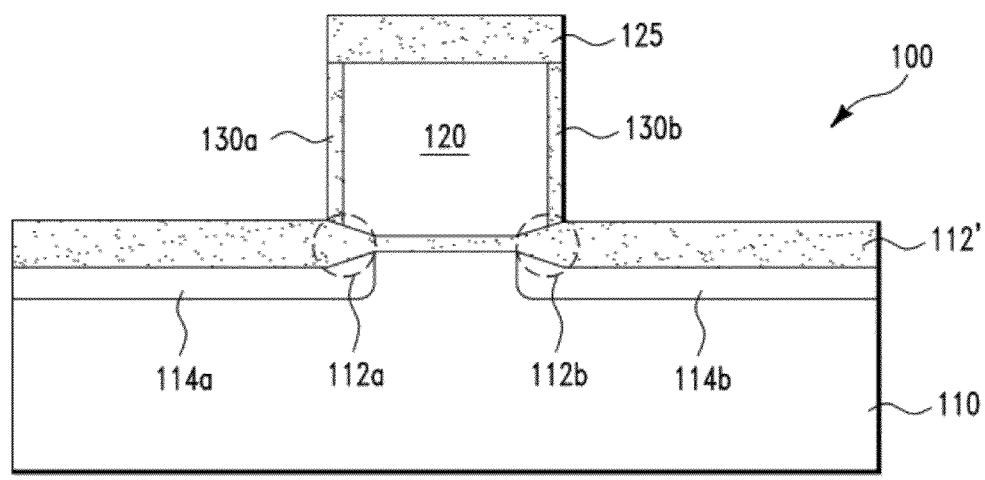

Next, with reference to FIG. 1D, in one embodiment, extension regions 114a and 114b are formed in the silicon substrate 110. The extension regions 114a and 114b can be formed using a conventional ion implantation process.

Figure 1E:
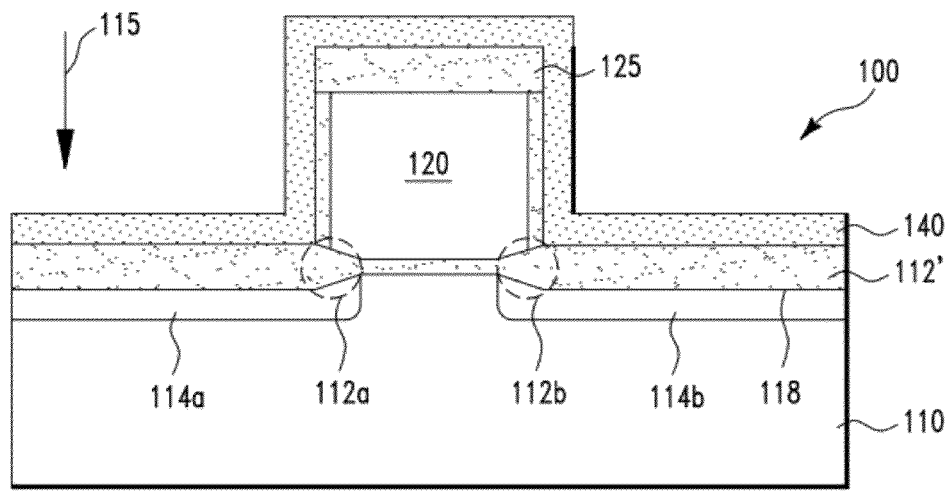

Next, with reference to FIG. 1E, in one embodiment, a spacer layer 140 is formed on top of the structure 100 of FIG. 1D. The spacer layer 140 can comprise silicon nitride. The spacer layer 140 can be formed by CVD of silicon nitride on top of the structure 100 of FIG. 1D resulting in the spacer layer 140.

Figure 1F:
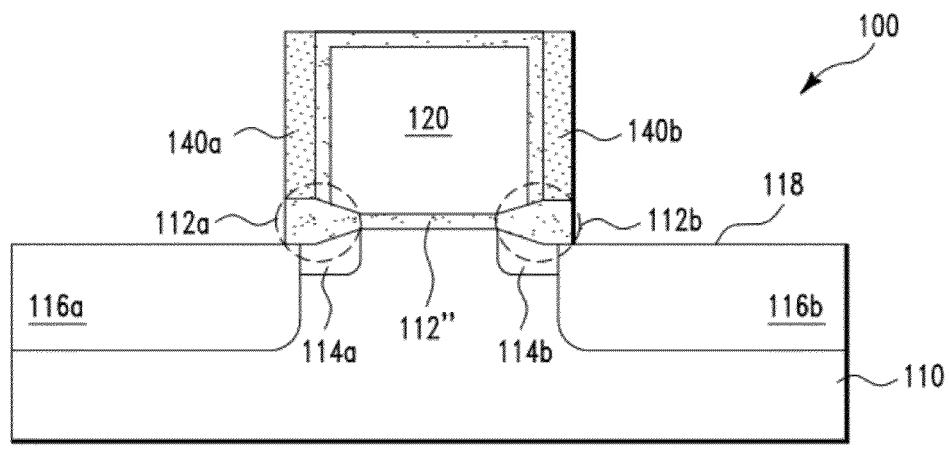

Next, in one embodiment, the spacer layer 140 and the temporary gate dielectric layer 112' are anisotropically etched in the direction 115 until the top surface 118 of the silicon substrate 110 is exposed to the surrounding ambient resulting in the structure 100 of FIG. 1F. After the etching of the spacer layer 140 and the temporary gate dielectric layer 112 is performed, with reference to FIG. 1F, what remain of the spacer layer 140 are spacer regions 140a and 140b, whereas what remains of the temporary gate dielectric layer 112 is the temporary gate dielectric region 112" which includes the bird's beaks 112a and 112b.

Next, with reference to FIG. 1F, in one embodiment, source/drain regions 116a and 116b are formed in the silicon substrate 110. The source/drain regions 116a and 116b can be formed using a conventional ion implantation process.

Figure 1G:
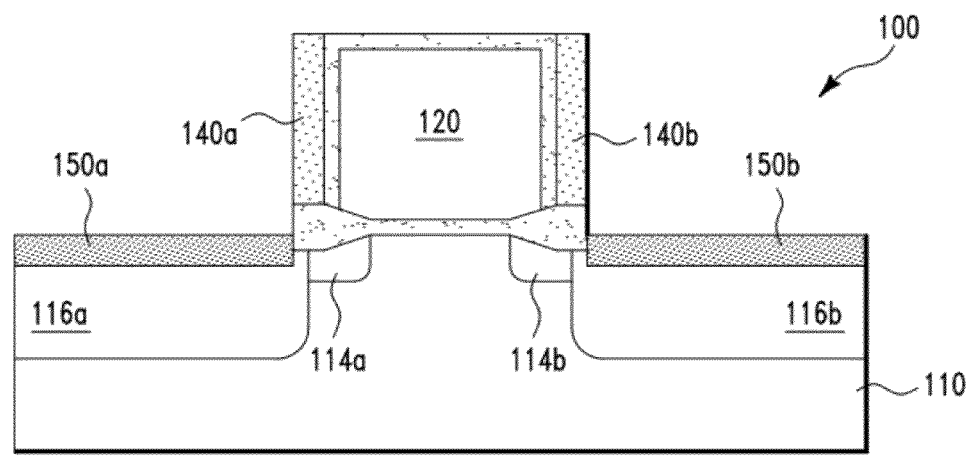

Next, with reference to FIG. 1G, in one embodiment, silicide regions 150a and 150b are formed on the source/drain regions 116a and 116b, respectively. More specifically, the silicide regions 150a and 150b can be formed by (i) depositing a metal layer (not shown) on top of the structure 100 of FIG. 1F, then (ii) heating the structure 100 resulting in the metal chemically reacting with silicon of the source/drain regions 116a and 116b, and then (iii) removing unreacted metal resulting in the silicide regions 150a and 150b. If the metal used is nickel, then the silicide regions 150a and 150b comprise nickel silicide.

Figure 1H:
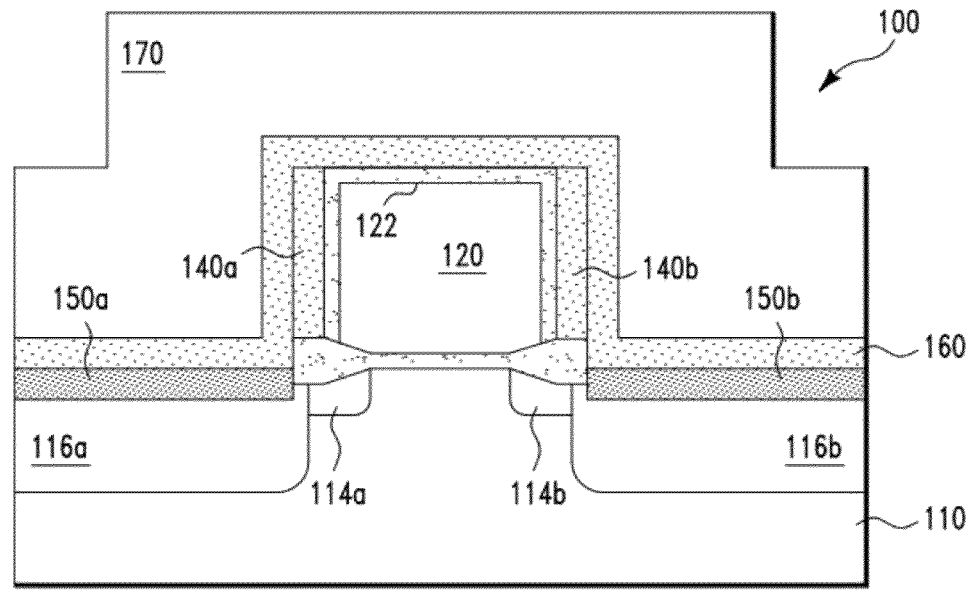

Next, with reference to FIG. 1H, in one embodiment, a silicon nitride layer 160 and a BPSG (boro-phospho-silicate glass) layer 170 are formed in turn on top of the structure 100 of FIG. 1G. More specifically, the silicon nitride layer 160 and the BPSG layer 170 can be formed by (i) depositing silicon nitride on top of the structure 100 of FIG. 1G resulting in the silicon nitride layer 160 and then (ii) depositing BPSG on top of the silicon nitride layer 160 resulting in the BPSG layer 170.

Figure 1I:
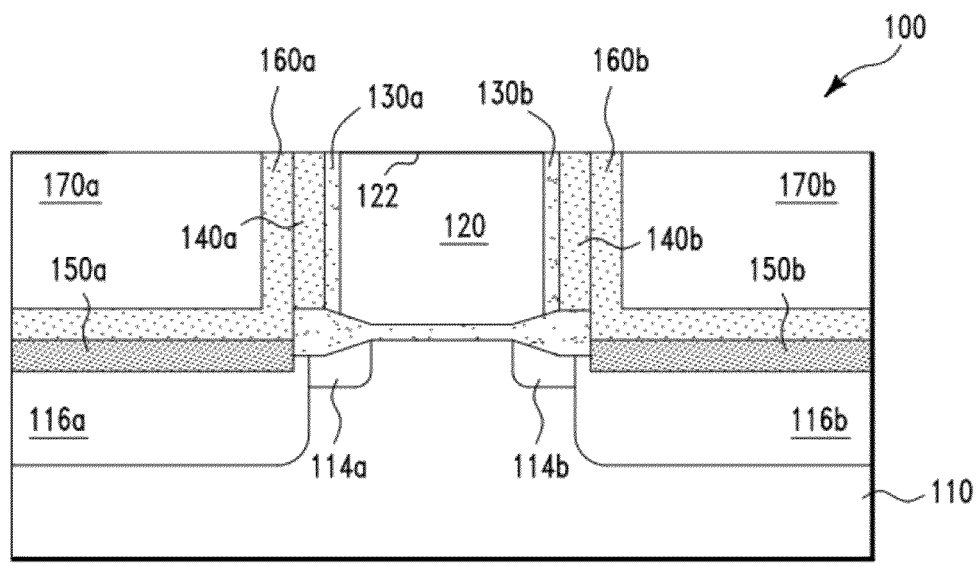

Next, in one embodiment, a CMP (Chemical Mechanical Polishing) process is performed on top of the structure 100 of FIG. 1H until the top surface 122 of the temporary gate electrode region 120 is exposed to the surrounding ambient resulting in the structure 100 of FIG. 1I. After the CMP process is performed, what remain of the BPSG layer 170 are BPSG regions 170a and 170b, and what remain of the silicon nitride layer 160 are silicon nitride regions 160a and 160b.

Figure 1J:
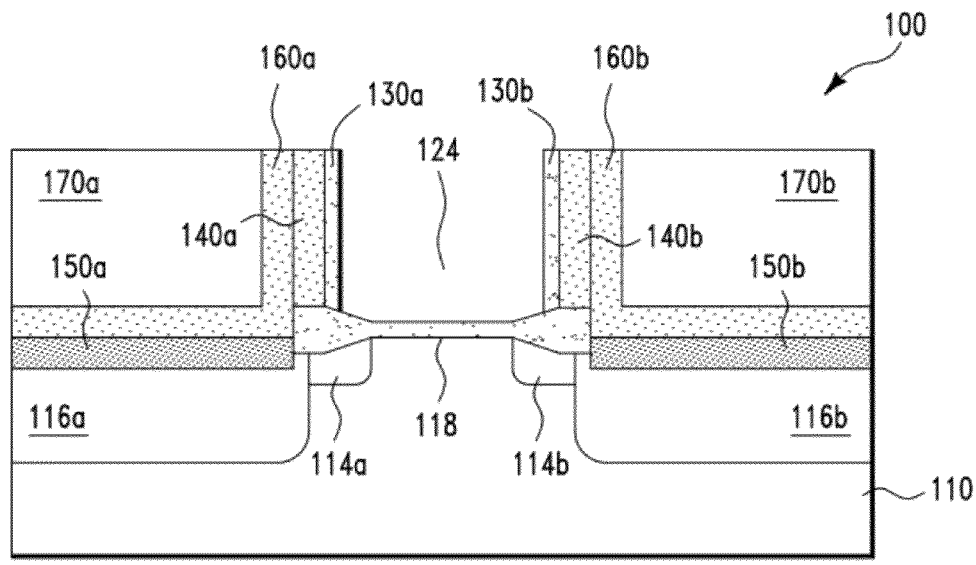

Next, with reference to FIG. 1I, in one embodiment, the temporary gate electrode region 120 is removed resulting in a trench 124 of FIG. 1J. The temporary gate electrode region 120 can be removed using a wet etching process.

Figure 1K:
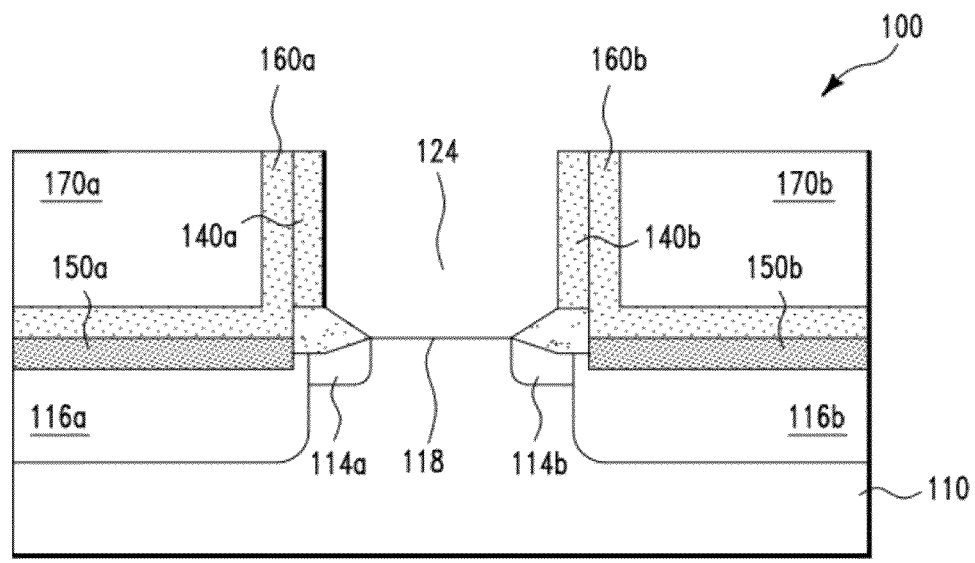

Next, with reference to FIG. 1J, silicon dioxide on side walls and bottom walls of the trench 124 is removed (by using a wet etching process, for example) resulting in the top surface 118 of the silicon substrate 110 being exposed to the surrounding ambient, as shown in FIG. 1K. After the removal, what remain of the temporary gate dielectric region 112" are the bird's beaks 112a and 112b.

Figure 1L:
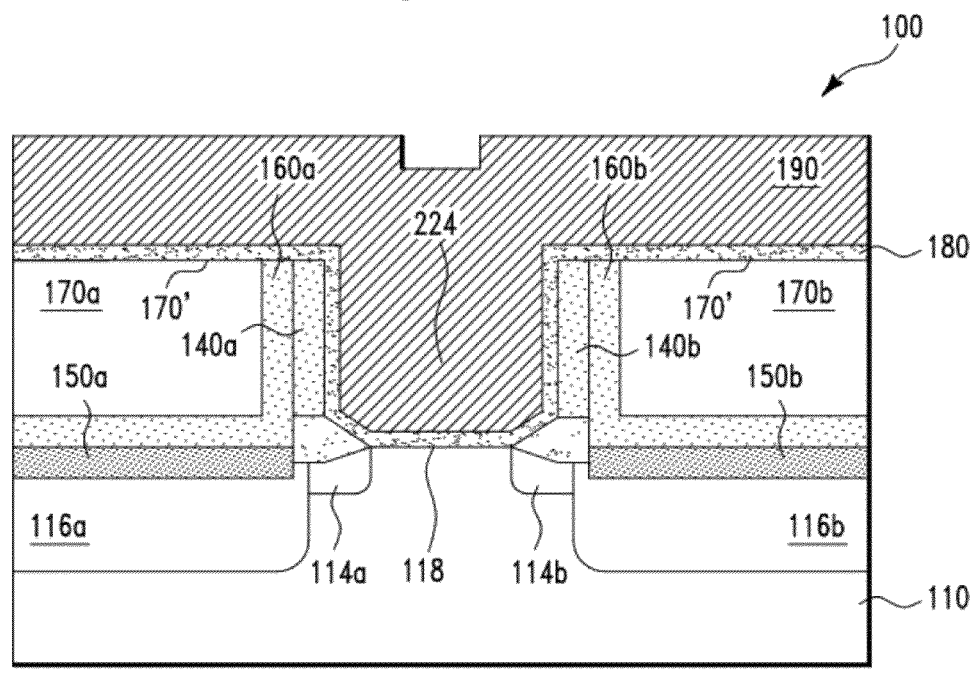

Next, with reference to FIG. 1L, in one embodiment, a final gate dielectric layer 180 and a final gate electrode layer 190 are formed in turn on top of the structure 100 of FIG. 1K. The final gate dielectric layer 180 can comprise a high-K dielectric material, wherein K is dielectric constant and K is greater than 4. For example, the final gate dielectric layer 180 comprises hafnium silicon oxynitride (HfSiON). The final gate electrode layer 190 can comprise a metal such as tantalum nitride (TaN). The final gate dielectric layer 180 and the final gate electrode layer 190 can be formed by (i) CVD or ALD (Atomic Layer Deposition) of the hafnium silicon oxynitride on top of the structure 100 of FIG. 1K resulting in the final gate dielectric layer 180 and then (ii) CVD or ALD of tantalum nitride on top of the final gate dielectric layer 180 such that the trench 124 is completely filed with tantalum nitride resulting in the final gate electrode layer 190.

Figure 1M:
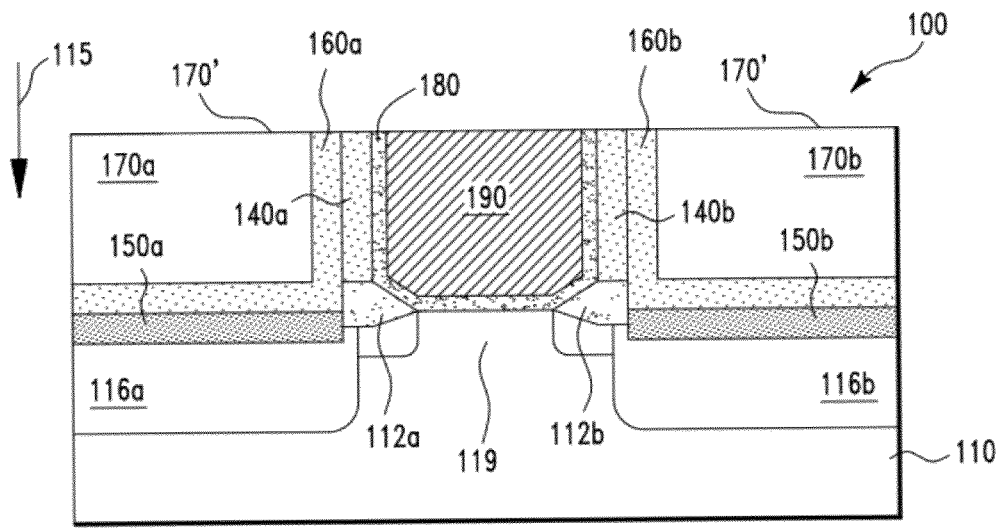

Next, in one embodiment, a CMP process is performed on top of the structure 100 of FIG. 1L until the top surface 170' of the BPSG regions 170a and 170b is exposed to the surrounding ambient resulting in the structure 100 of FIG. 1M. After the CMP process is performed, what remain of the final gate dielectric layer 180 and the final gate electrode layer 190 are the final gate dielectric region 180 and the final gate electrode region 190, respectively. In one embodiment, each of the bird's beaks 112a and 112b overlaps the final gate electrode region 190 in the direction 115. A first region is said to overlap a second region in a reference direction if and only if there exits at least one point inside the first region such that a straight line going through that point and being parallel to the reference direction would intersect the second region.

Next, in one embodiment, interconnect layers (not shown) are formed on top of the structure 100 to provide electrical access to the source/drain regions 116a and 116b and the final gate electrode region 190.

With reference to FIG. 1M, the structure 100 shows a transistor having the final gate electrode region 190, the final gate dielectric region 180, the source/drain regions 116a and 116b and the channel 119. The presence of the bird's beaks 112a and 112b at corners of the final gate electrode region 190 increases the distances between the final gate electrode region 190 and the source/drain regions 116a and 116b and thereby helps reduce leakage currents between the final gate electrode region 190 and the source/drain regions 116a and 116b during the operation of the transistor.

FIGS. 2A-2L show cross-section views used to illustrate a fabrication process of a semiconductor structure 200, in accordance with embodiments of the present invention. More specifically, with reference to FIG. 2A, the fabrication process of the semiconductor structure 200 can start with the structure 200 of FIG. 2A. The structure 200 is similar to the structure 100 of FIG. 1B. The formation of the structure 200 is similar to the formation of FIG. 1B.

Figure 2A:
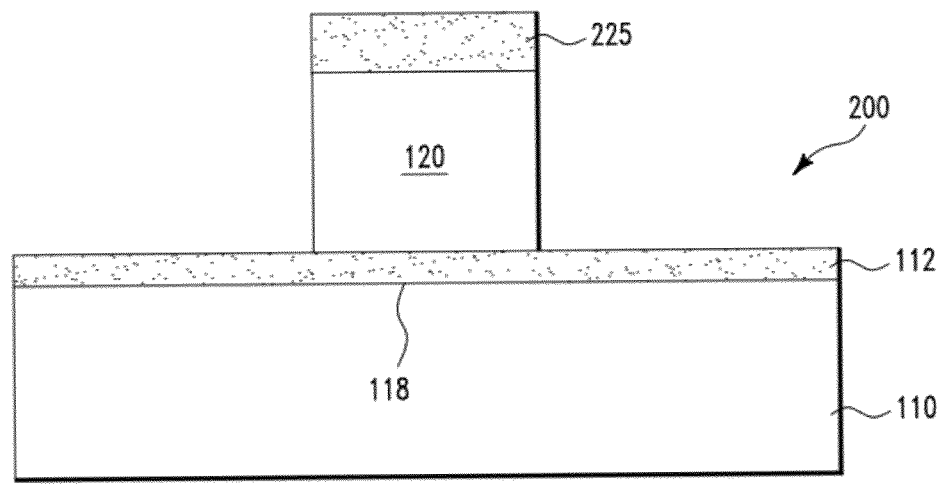
FIGS. 2A-2L show cross-section views used to illustrate a fabrication process of another semiconductor structure, in accordance with embodiments of the present invention.
Figure 2B:
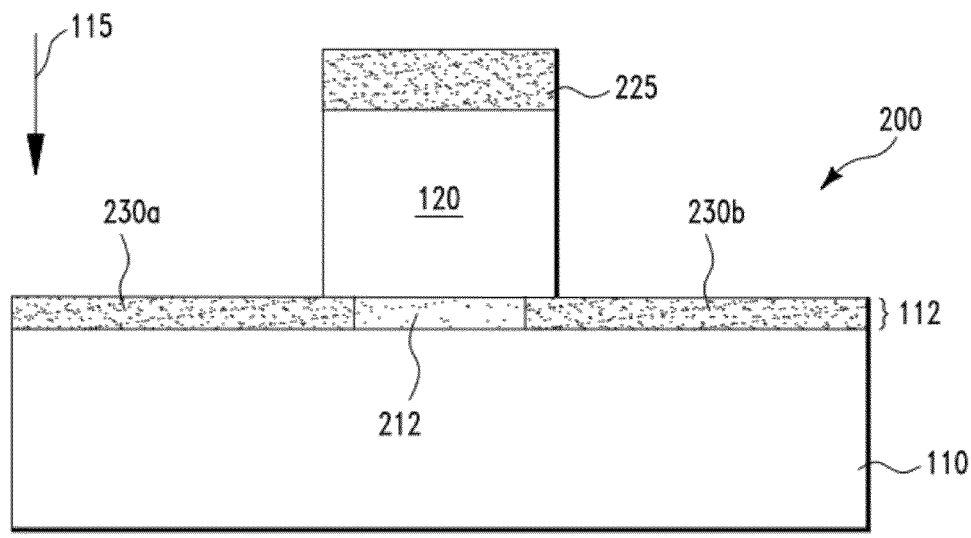

Next, in one embodiment, the structure 200 is annealed in ammonia ($NH_3$) or ammonia plasma resulting in silicon dioxide of the cap region 225 and exposed portions of the temporary gate dielectric layer 112 being converted to SiON, as shown in FIG. 2B. More specifically, with reference to FIG. 2B, dielectric regions 230a and 230b of the temporary gate dielectric layer 112 now comprise SiON, whereas the temporary gate dielectric region 212 still comprises silicon dioxide. The cap region 225 now comprises SiON. In one embodiment, the annealing of the structure 200 is performed such that the dielectric regions 230a and 230b undercut the temporary gate electrode region 120. As a result, both the dielectric regions 230a and 230b overlap the temporary gate electrode region 120 in the direction 115.

Figure 2C:
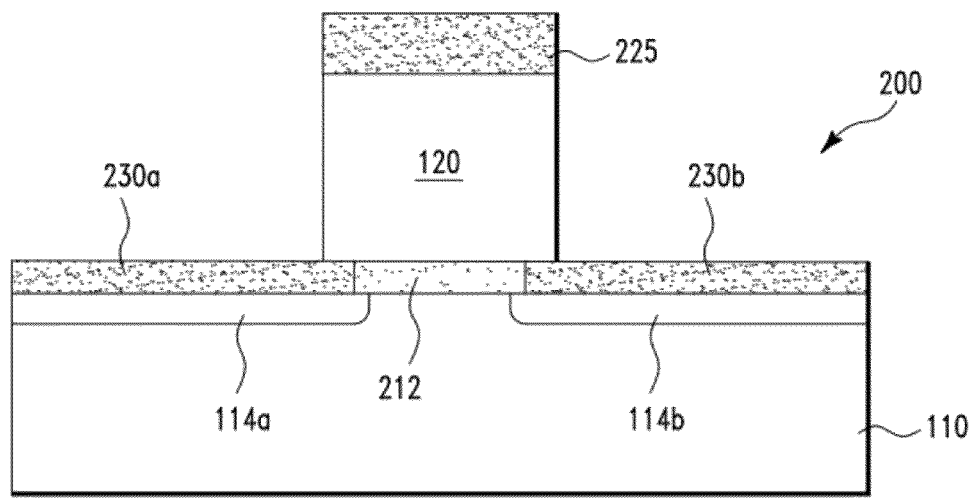

Next, with reference to FIG. 2C, in one embodiment, extension regions 114a and 114b are formed in the silicon substrate 110. The extension regions 114a and 114b can be formed using a conventional ion implantation process.

Figure 2D:
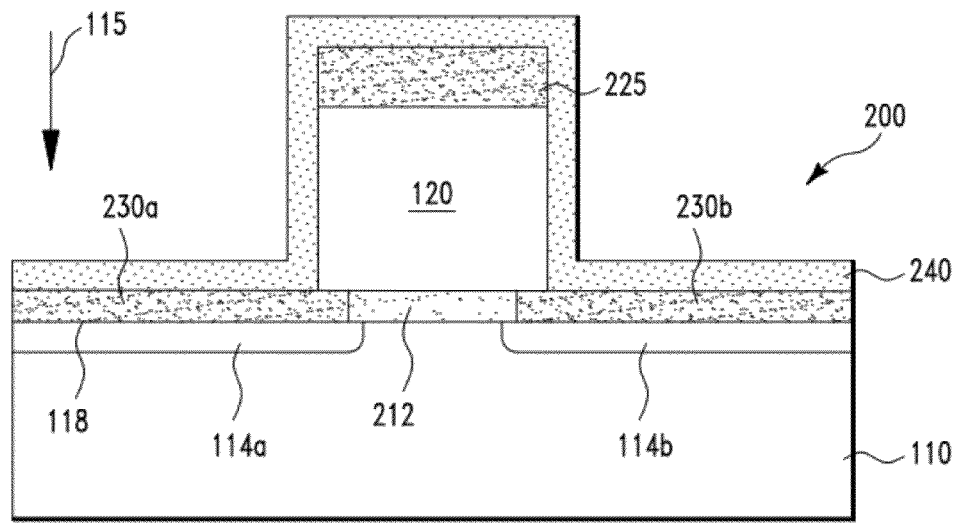

Next, with reference to FIG. 2D, in one embodiment, a spacer layer 240 is formed on top of the structure 200 of FIG. 2C. The spacer layer 240 can comprise silicon nitride. The spacer layer 240 can be formed by CVD of silicon nitride on top of the structure 200 of FIG. 2C resulting in the spacer layer 240.

Figure 2E:
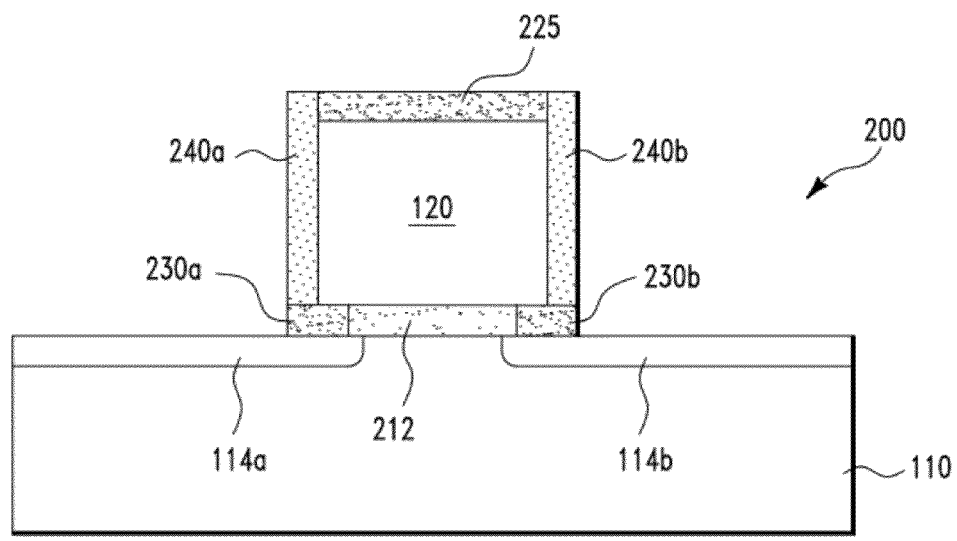

Next, in one embodiment, the spacer layer 240 and the dielectric regions 230a and 230b are anisotropically etched in the direction 115 until the top surface 118 of the silicon substrate 110 is exposed to the surrounding ambient resulting in the structure 100 of FIG. 2E. After the etching of the spacer layer 240 and the dielectric regions 230a and 230b is performed, with reference to FIG. 2E, what remain of the spacer layer 240 are spacer regions 240a and 240b, whereas what remain of the dielectric regions 230a and 230b are gate dielectric corner regions 230a and 230b.

Figure 2F:
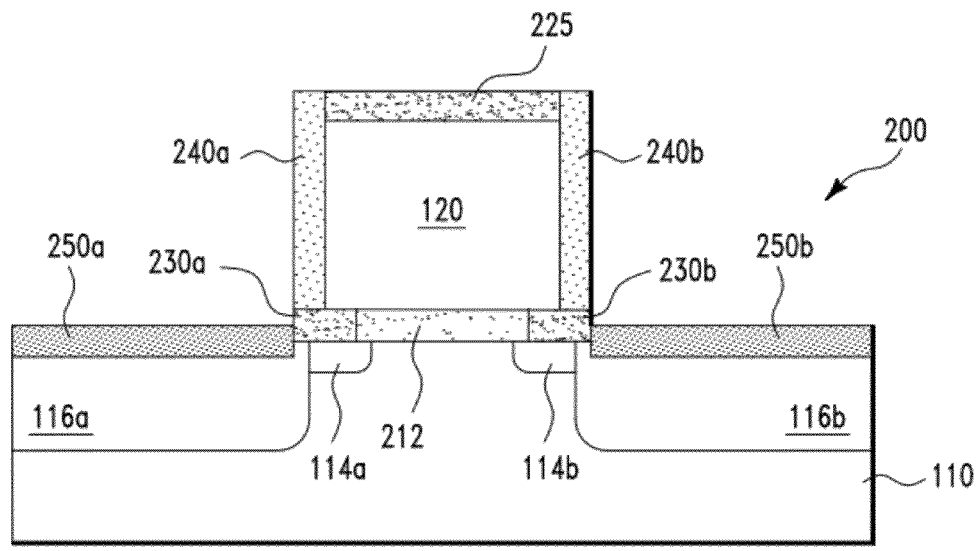

Next, with reference to FIG. 2F, in one embodiment, source/drain regions 116a and 116b are formed in the silicon substrate 110. The source/drain regions 116a and 116b can be formed using a conventional ion implantation process.

Next, in one embodiment, silicide regions 250a and 250b are formed on the source/drain regions 116a and 116b, respectively. More specifically, the silicide regions 250a and 250b can be formed in a manner similar to the manner in which the silicide regions 150a and 150b are formed on the source/drain regions 116a and 116b of the structure 100 of FIG. 1G.

Figure 2G:
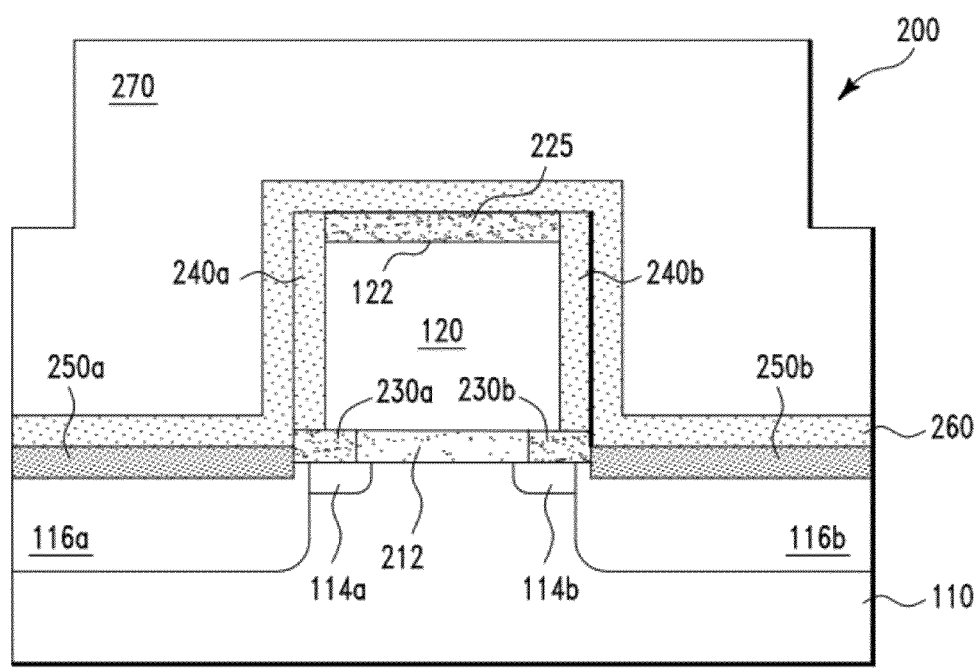

Next, with reference to FIG. 2G, in one embodiment, a silicon nitride layer 260 and a BPSG layer 270 are formed in turn on top of the structure 200 of FIG. 2F. More specifically, the silicon nitride layer 260 and the BPSG layer 270 can be formed by (i) depositing silicon nitride on top of the structure 200 of FIG. 2F resulting in the silicon nitride layer 260 and then (ii) depositing BPSG on top of the silicon nitride layer 260 resulting in the BPSG layer 270.

Figure 2H:
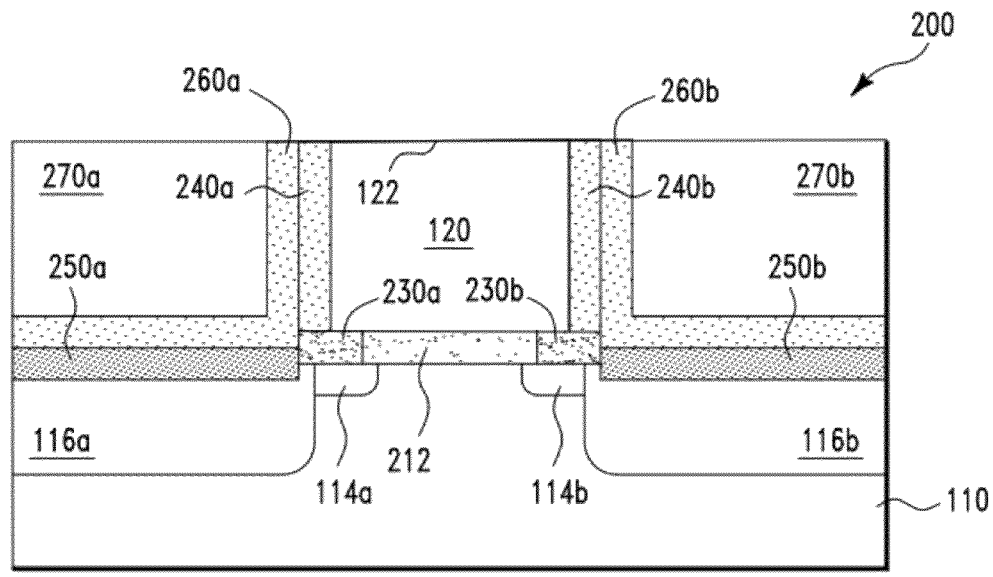

Next, in one embodiment, a CMP process is performed on top of the structure 200 of FIG. 2G until the top surface 122 of the temporary gate electrode region 120 is exposed to the surrounding ambient resulting in the structure 200 of FIG. 2H. After the CMP process is performed, what remain of the BPSG layer 270 are BPSG regions 270a and 270b, and what remain of the silicon nitride layer 260 are silicon nitride regions 260a and 260b.

Figure 2I:
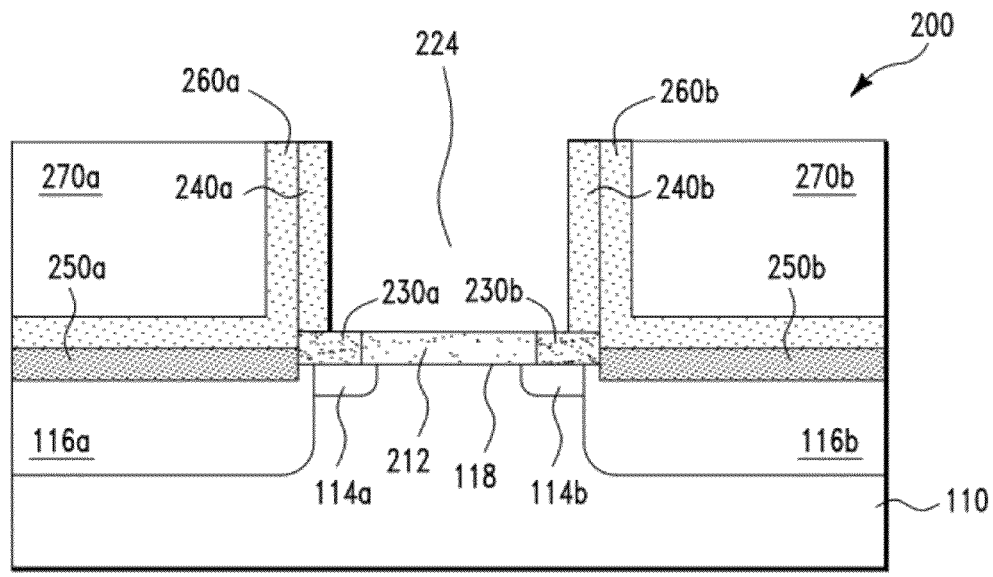

Next, with reference to FIG. 2H, in one embodiment, the temporary gate electrode region 120 is removed resulting in a trench 224 of FIG. 2I. The temporary gate electrode region 120 can be removed using a wet etching process.

Figure 2J:
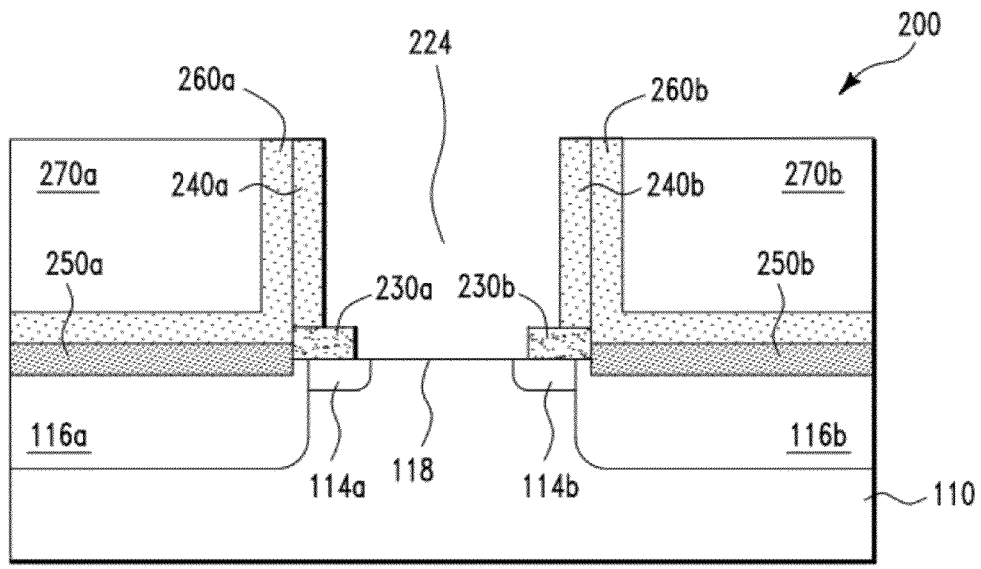

Next, with reference to FIG. 2I, in one embodiment, the temporary gate dielectric region 212 is removed resulting in the top surface 118 of the silicon substrate 110 being exposed to the surrounding ambient, as shown in FIG. 2J. The temporary gate dielectric region 212 can be removed by a conventional wet etching process.

Figure 2K:
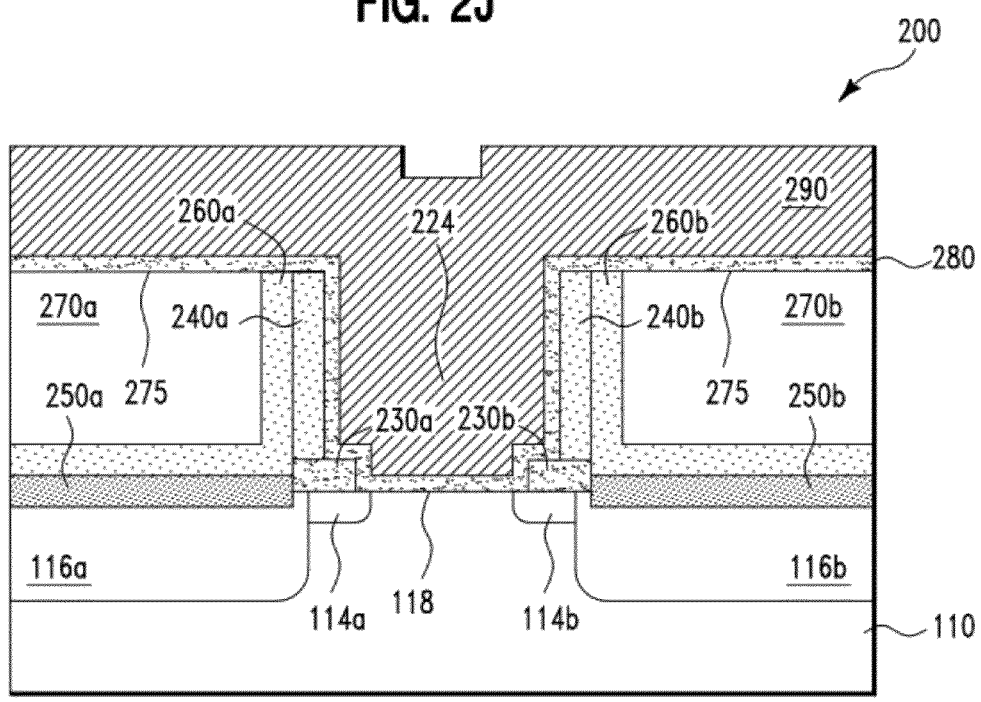

Next, with reference to FIG. 2K, in one embodiment, a final gate dielectric layer 280 and a final gate electrode layer 290 are formed in turn on top of the structure 200 of FIG. 2J. The final gate dielectric layer 280 can comprise a high-K dielectric material. For example, the final gate dielectric layer 280 comprises hafnium silicon oxynitride (HfSiON). The final gate electrode layer 290 can comprise a metal such as tantalum nitride (TaN). The final gate dielectric layer 280 and the final gate electrode layer 290 can be formed by (i) CVD or ALD (Atomic Layer Deposition) of the hafnium silicon oxynitride on top of the structure 200 of FIG. 2K resulting in the final gate dielectric layer 280 and then (ii) CVD or ALD of tantalum nitride on top of the final gate dielectric layer 280 such that the trench 224 is completely filed with tantalum nitride resulting in the final gate electrode layer 290.

Figure 2L:
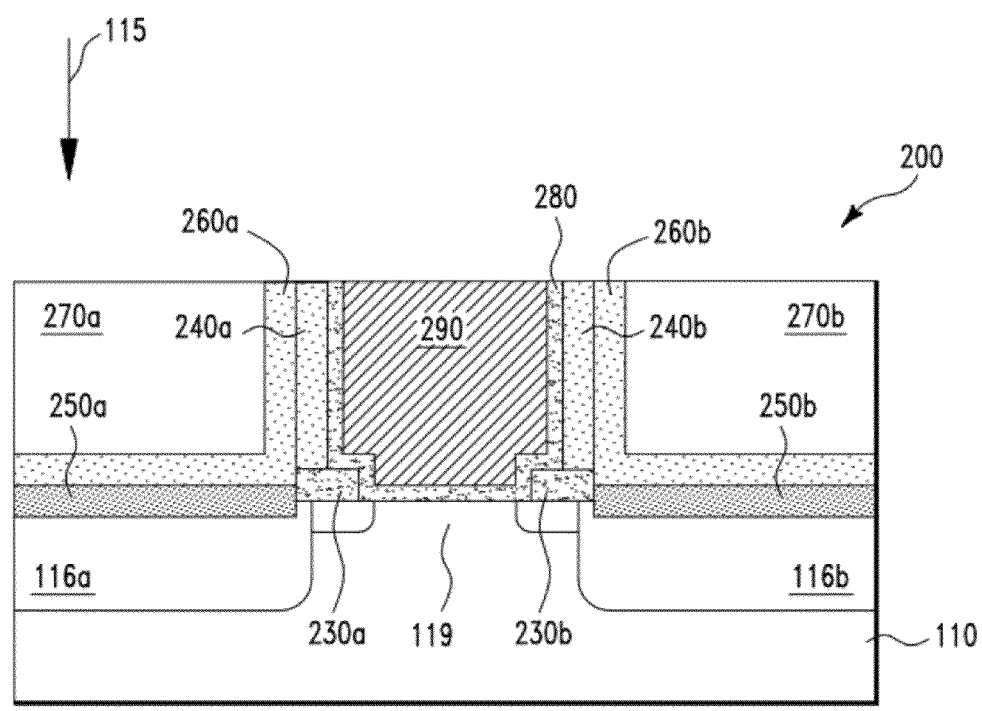

Next, in one embodiment, a CMP process is performed on top of the structure 200 of FIG. 2K until the top surface 270' of the BPSG regions 270a and 270b is exposed to the surrounding ambient resulting in the structure 200 of FIG. 2L. After the CMP process is performed, what remain of the final gate dielectric layer 280 and the final gate electrode layer 290 are the final gate dielectric region 280 and the final gate electrode region 290, respectively. In one embodiment, each of the gate dielectric corner regions 230a and 230b overlaps the final gate electrode region 290 in the direction 115.

Next, in one embodiment, interconnect layers (not shown) are formed on top of the structure 200 to provide electrical access to the source/drain regions 116a and 116b and the final gate electrode region 290.

With reference to FIG. 2L, the structure 200 shows a transistor having the final gate electrode region 290, the final gate dielectric region 280, the source/drain regions 116a and 116b and the channel 119. The presence of the gate dielectric corner regions 230a and 230b at corners of the final gate electrode region 290 increases the distances between the final gate electrode region 290 and the source/drain regions 116a and 116b and thereby helps reduce leakage currents between the final gate electrode region 290 and the source/drain regions 116a and 116b during the operation of the transistor.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
   a semiconductor substrate which includes a channel region;
   a first source/drain region on the semiconductor substrate;
   a second source/drain region on the semiconductor substrate, wherein the channel region is disposed between the first and second source/drain regions;
   a final gate dielectric region,
      wherein the final gate dielectric region comprises a first dielectric material, wherein the final gate dielectric region is in direct physical contact with the channel region via an interfacing surface, and
      wherein the interfacing surface defines a reference direction perpendicular to the interfacing surface and pointing from the final gate dielectric region toward the channel region;
   a final gate electrode region,
      wherein the final gate dielectric region is disposed between and in direct physical contact with the channel region and the final gate electrode region, and
      wherein the final gate electrode region comprises an electrically conductive material; and
   a first gate dielectric corner region,
      wherein the first gate dielectric corner region comprises a second dielectric material that is different from the first dielectric material,
      wherein the first gate dielectric corner region is disposed between and in direct physical contact with the first source/drain region and the final gate dielectric region,
      wherein the first gate dielectric corner region is not in direct physical contact with the final gate electrode region, and
      wherein the first gate dielectric corner region overlaps the final gate electrode region in the reference direction.

2. The structure of claim 1, further comprising a second gate dielectric corner region,
   wherein the second gate dielectric corner region comprises the second dielectric material, wherein the second gate dielectric corner region is disposed between and in direct physical contact with the second source/drain region and the final gate dielectric region, wherein the second gate dielectric corner region is not in direct physical contact with the final gate electrode region, and wherein the second gate dielectric corner region overlaps the final gate electrode region in the reference direction.

3. The structure of claim 2, wherein the second dielectric material comprises silicon dioxide.

4. The structure of claim 2, wherein the second dielectric material comprises SiON.

5. The structure of claim 1, wherein the first dielectric material comprises hafnium silicon oxynitride.

6. The structure of claim 1, wherein the final gate dielectric region is in direct physical contact with the first gate dielectric corner region via a common surface, wherein the common surface defines a first direction perpendicular to the common surface and pointing from the final gate dielectric region toward the first gate dielectric corner region, and wherein the reference direction and the first direction point in different directions.

7. The structure of claim 6, wherein the reference direction and the first direction form an acute angle with respect to each other.

8. The structure of claim 1, wherein no portion of the first source/drain region is in direct physical contact with the final gate dielectric region.

9. The structure of claim 1, further comprising:

a silicide region that includes a silicide and is in direct physical contact with the first source/drain region; and a first silicon nitride region that includes silicon nitride and is in direct physical contact with the silicide region, wherein the silicide region is disposed between the first source/drain region and the first silicon nitride region.

10. The structure of claim 9, further comprising a second silicon nitride region that includes silicon nitride and is in direct physical contact with both the final gate dielectric region and the first silicon nitride region.

11. The structure of claim 10, wherein a total length of the first silicon nitride region in the reference direction exceeds a total length of the second silicon nitride region in the reference direction.

12. The structure of claim 10, further comprising a boro-phospho-silicate glass BPSG) region that includes BPSG and is in direct physical contact with the first silicon nitride region, wherein the first silicon nitride region is disposed between the silicide region and the BPSG region, and wherein the first silicon nitride region is further disposed between the second silicon nitride region and the BPSG region.

13. The structure of claim 1, further comprising a first extension region totally within the semiconductor substrate, wherein the semiconductor substrate comprises silicon, wherein the first extension region comprises ions implanted within silicon, and wherein the first extension region is in direct physical contact with both the first gate dielectric corner region and the first source/drain region.

14. The structure of claim 1, wherein the electrically conductive material of the final gate electrode region comprises a metal that is continuously distributed throughout a total interior space bounded by the final gate dielectric region.

15. The structure of claim 14, wherein the electrically conductive material of the final gate electrode region consists of the metal.

16. The structure of claim 11, wherein the metal is tantalum nitride.

17. The structure of claim 1, wherein the first gate dielectric corner region has a pentagonal shape.

18. The structure of claim 1, wherein the first gate dielectric corner region comprises a bird's beak.

* * * * *